United States Patent
Hazelwood

(10) Patent No.: US 7,807,952 B2
(45) Date of Patent: Oct. 5, 2010

(54) GAIN CALIBRATION IN EMCCD CAMERAS

(75) Inventor: Michael John Hazelwood, Woodbridge (GB)

(73) Assignee: E2V Technologies (UK) Limited, Chelmsford (GB)

( * ) Notice: Subject to any disclaimer, the term of this patent is extended or adjusted under 35 U.S.C. 154(b) by 0 days.

(21) Appl. No.: 11/705,821

(22) Filed: Feb. 14, 2007

(65) Prior Publication Data
US 2007/0214200 A1   Sep. 13, 2007

(30) Foreign Application Priority Data
Feb. 14, 2006  (GB) .................... 0602965.6

(51) Int. Cl.
H01L 27/00   (2006.01)
H03F 3/08    (2006.01)
H04N 3/14    (2006.01)

(52) U.S. Cl. ............... 250/208.1; 250/214 A; 348/311

(58) Field of Classification Search ............... 250/208.1, 250/214 A; 348/311
See application file for complete search history.

(56) References Cited

U.S. PATENT DOCUMENTS

| | | | |
|---|---|---|---|
| 4,585,934 A | 4/1986 | French et al. | |
| 5,337,340 A | 8/1994 | Hynecek | |
| 6,444,968 B1 | 9/2002 | Burt et al. | |
| 7,291,821 B2 | 11/2007 | Robbins | |
| 2002/0093288 A1 | 7/2002 | Spencer et al. | |
| 2003/0035057 A1 | 2/2003 | Hakamata et al. | |
| 2003/0223531 A1 | 12/2003 | Kashima et al. | |
| 2004/0150737 A1* | 8/2004 | Pool et al. ............ | 348/311 |
| 2006/0163474 A1 | 7/2006 | Denvir | |
| 2007/0200052 A1 | 8/2007 | Seyfried et al. | |

FOREIGN PATENT DOCUMENTS

| | | |
|---|---|---|
| EP | 1 688 960 | 8/2006 |
| GB | A-2371403 A | 7/2002 |
| GB | 2 413 007 A | 10/2005 |
| JP | 2003-009000 | 1/2003 |

(Continued)

OTHER PUBLICATIONS

Robbins, Mark Stanford, et al., "The Noise Performance of Electron Multiplying Charge-Coupled Devices," *IEEE Transactions on Electron Devices*, vol. 50, No. 5, May 2003.

(Continued)

*Primary Examiner*—Thanh X Luu
(74) *Attorney, Agent, or Firm*—Venable LLP; Robert Kinberg; Steven J. Schwarz

(57) ABSTRACT

A CCD device of the type which provides gain by impact ionisation in a multiplication register includes an arrangement for production of a first output signal derived from a known input with multiplication applied and a second output signal derived from a different input with unit gain applied. Using the known ratios of the two signals, the gain of the multiplication register can be determined. The two signals can be derived from accumulating thermal charge in elements a CCD image device and by summing charge to produce a signal processed with unity gain and by averaging charge for use with the signal with gain applied. An alternative embodiment uses an extra light source for producing input signals of known ratio.

12 Claims, 5 Drawing Sheets

FOREIGN PATENT DOCUMENTS

WO  WO-2005/013605 A1  2/2005

OTHER PUBLICATIONS

UK Patent Office Search Report, dated Jan. 25, 2006, issued in connection with counterpart British Application No. GB0521651.0.

Jaroslav Hynecek, "Impactron—A New Solid State Image Intensifier", IEEE Transactions on Electron Devices, Oct. 2001, pp. 2238-2241, vol. 48, No. 10, Piscataway, NJ, US.

Search Report from EP Application No. 07250602.5-1241, dated Apr. 24, 2008.

UK Search Report dated Jan. 7, 2008, issued in connection with counterpart GB Application No. GB0717484.0.

Written Opinion issued by the European Patent Office on Dec. 1, 2009, in corresponding Netherlands Appl. NL1032725 (with partial English language translation).

UK Search Report dated Jun. 29, 2006, issued in connection with counterpart British Application No. GB0602965.6.

* cited by examiner

GAIN CALIBRATION IN EMCCD CAMERAS

CROSS-REFERENCE TO RELATED APPLICATION

This application claims the priority of GB 0602965.6, filed Feb. 14, 2006, the disclosure of which is incorporated herein by reference.

FIELD OF THE INVENTION

The present invention relates to a CCD device, and in particular to a CCD which provides gain within the charge domain.

BACKGROUND OF THE INVENTION

In a typical CCD imager, signal charge representative of incident radiation is accumulated in an array of pixels in an image area. Following an integration period, signal charge is transferred to a store section and then to an output register by applying appropriate clocking or drive pulses to control electrodes. The signal charge is then read out from the output register and applied to a charge detection circuit to produce a voltage that is representative of the amount of signal charge. The sensitivity of such a device is limited by the noise of the charge to voltage conversion process and that introduced by the subsequent video chain electronics.

An electron multiplying CCD overcomes this limitation and is disclosed in our earlier published UK patent application GB-A-2,371,403, as shown in FIG. 1. A CCD imager 1 comprises an image area 2, a store section 3 and an output or read-out register 4, each of these components being found in a conventional CCD imager. The output register 4 is extended serially to give a multiplication register 5, the output of which is connected to a charge detection circuit 6.

During operation of the device, incident radiation is converted at the image area 2 into signal charge which is representative of the intensity of the radiation impinging on the array of pixels making up the image array. Following the image acquisition period, drive pulses are applied to control electrodes 7 to transfer the charge accumulated at the pixels of the image area 2 to the store section 3. Simultaneously with this, drive signals are also applied to control electrodes 8 at the store section 3 to cause charge to be transferred from row to row as indicated by the arrow, the last row of charge held in elements in row 3 being transferred in parallel to the output register 4.

When a row of signal charge has been transferred into the output register 4, appropriate drive pulses are applied to the electrodes 9 to sequentially transfer the charge from the elements of the output register to those of the multiplication register 5. In this embodiment, the multiplication register is of similar architecture to the output register in so far as doping is concerned with the addition of an electrode for multiplication.

To achieve multiplication of charge in each of the elements of the multiplication register 5, sufficiently high amplitude drive pulses are applied to control electrodes 10 to both transfer signal charge from one element to the next adjacent element in the direction shown by the arrow and also to increase the level of signal charge due to impact ionisation by an amount determined by the amplitude of the drive pulses. Thus, as each packet of charge is transferred from one element to the next through the multiplication register, the signal charge increases. The charge detected at circuit 6 is thus a multiplied version of the signal charge collected in the output register 4. At each stage of the multiplication register, the signal charge is increased. Each signal charge packet stored in the output register 4 undergoes an identical multiplication process as each travels through all the elements of the multiplication register 5.

The output of the charge detection circuit 6 is also applied to an automatic gain control circuit 11 that adjusts the voltages applied to the multiplication register 5 to control the gain. In other embodiments, this feedback arrangement is omitted. Gain may then be controlled manually if desired.

Whilst the gain control circuit can vary the gain provided by varying the voltages applied to the multiplication register, we have appreciated the need to determine the actual level of gain provided by such a CCD charge multiplication arrangement. One way to measure the gain is to arrange a structure in the multiplication register to allow direct injection of charge, which can then be measured at the output. The difficulty with this approach is that the amount of charge injected cannot be precisely defined.

The approach usually taken to measure the gain is to illuminate the device and to measure the output with no multiplication gain. The light level is then reduced by a known fraction (by reducing the aperture of the optics or using neutral density filters for example). The reduction of light level will be of the same order as the gain to be measured. Multiplication gain is then applied and the output signal is measured. The multiplication gain can be calculated knowing the output signal and the reduction in light level. This method can give accurate results but is cumbersome and not particularly suitable for automatic measurements within a camera system.

We have appreciated an improved arrangement and method for measuring gain is required.

SUMMARY OF INVENTION

The invention is defined in the claims to which reference is now directed. The invention determines the gain provided by a multiplication register by measuring an output signal derived from a first input signal with gain applied to the multiplication register and measuring an output derived from a second input signal without gain applied. There are two approaches to generating the two output signals which may be used alone or in combination. A first approach is to vary the input signal to the multiplication register, such as by summing charge at the input. A second approach is to vary the output signal from the multiplication register, such as by summing charge at the output. In either approach, the second output signal is effectively larger than the first output signal by a known amount. The gain provided can then be determined as a function of the ratios of the output signals.

The preferred embodiment of the invention provides various techniques for creating the first and second input signals such that the second signal is known to be effectively larger than the first by a known amount. A first technique embodying the invention is to sum charge accumulated in a plurality of elements to provide the second input signal (though the summing may be at an output, rather than an input as noted above) and to derive the first signal from one such element or by averaging (rather than summing) the charge in the plurality of elements. This creates a second input signal that is effectively a multiple of the first signal; the multiple being equal to the number of elements.

A second technique, in a camera embodying the invention, is to provide first and second input signals to the multiplication register by illuminating light sensitive elements before the multiplication register using a light source within the camera of first and second different illumination strengths to produce the first and second respective input signals.

In embodiments using either the first or second techniques, the second input signal may typically be effectively 3 orders of magnitude greater than the first input signal. The multiplication register provides gain of around 1,000, so the output signals will be similar with and without gain. The actual gain provided can then be determined from the ratio of the input signals. When using lower gains such as ×10, it is preferable to sum charge at the input to the multiplication register to ensure an adequate output signal.

A benefit of the arrangements embodying the invention is that the gain can be measured real-time during operation of a camera embodying the invention.

Existing electron multiplier CCD based cameras have no provision for determination of actual gain value. This can lead to various compromises in the camera performance since gain has to be estimated from knowledge of the applied voltage on the CCD Gain phase. Unfortunately the Voltage/Gain transfer function is extremely non-linear, and the voltage required to produce a particular Gain value will vary as a function of both time and temperature. In order to maintain optimal camera performance it becomes necessary to age the cameras for 100 hours prior to shipment, and to re-calibrate after approximately 1000 hours. This can be very inconvenient, particularly where the camera has been installed in an in-accessible location. In addition, the existing designs only allow the user to observe a 16 bit digital number, which is broadly indicative of gain, but which only has limited value for short-term comparison between related measurements. Embodiments of the invention overcome these problems.

The adjustment of gain is preferably provided by adjusting the phase relationship between electrodes in the multiplication register. This has the advantage that gain can be adjusted rapidly for calibration, whilst allowing the gain to be restored precisely to the original operational level. Alternatively, the gain could be varied by adjusting the voltage between electrodes.

The embodiments provide automatic measurement of gain in real-time; the main embodiment using thermally generated charge as a signal source. A camera embodying the invention is designed to allow this calibration to take place during field blanking intervals.

BRIEF DESCRIPTION OF THE DRAWINGS

An embodiment of the invention will now be described by way of example and with reference to the accompanying figures in which.

DETAILED DESCRIPTION

Figure 1:
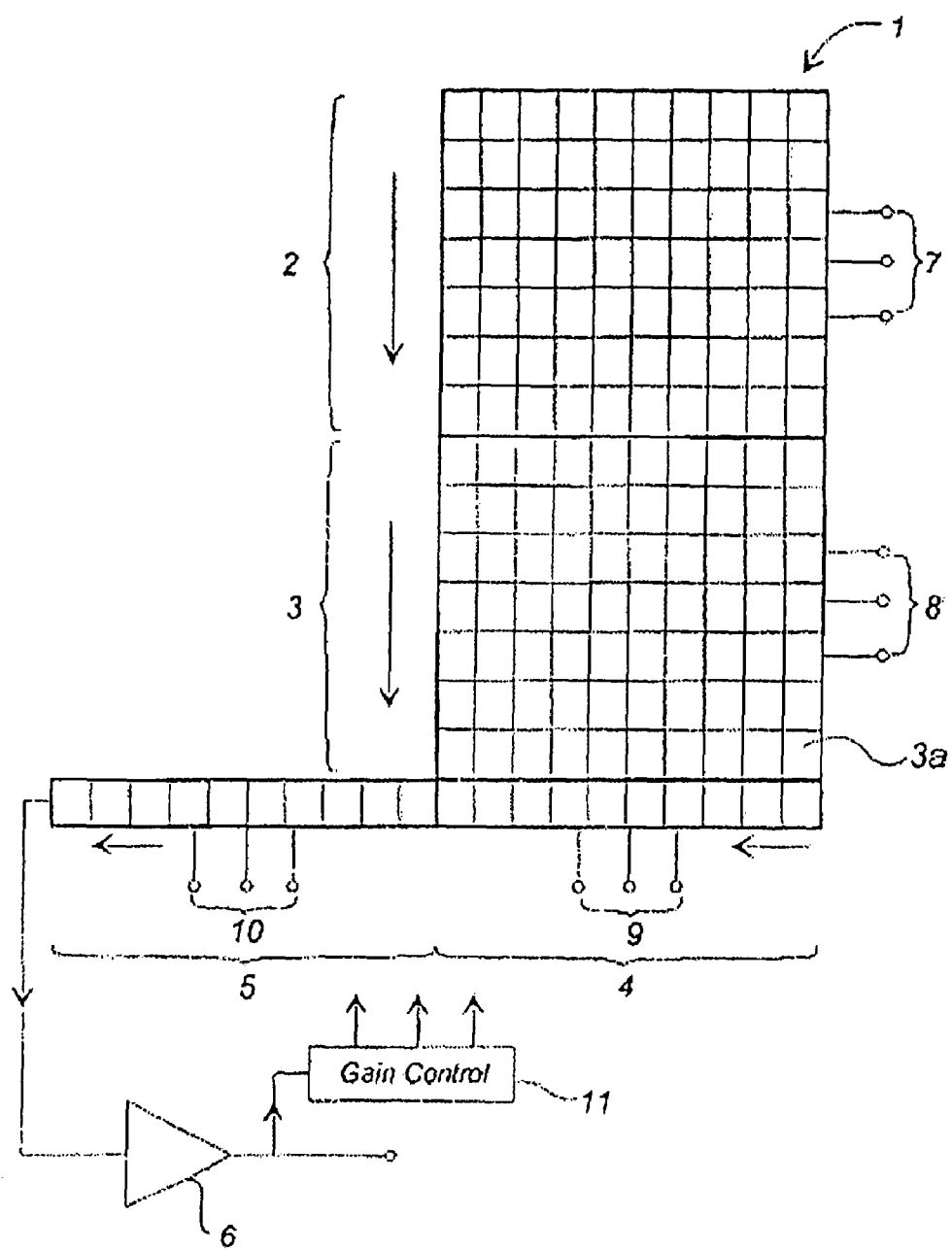
FIG. 1: is a schematic diagram of a CCD imager of known type and which may embody the invention.

A known device is shown and has been described in relation to FIG. 1. The invention may be embodied in such a device, and in an imager or camera including such a device. The arrangement of a multiplication register and elements within that register to which the invention may be applied will first be described with reference to FIGS. 1 to 3.

As shown in FIG. 1, an image area 2 accumulates charge in CCD elements and transfers charge under control of clocked drive pulses on electrodes 7, 8 to a store area 3 and from the store area to an output register 4 and subsequently to a multiplication register 5. It is in the multiplication register that the invention is embodied, though it will be appreciated that other arrangements of multiplication elements could be used. Although shown as a straight-line extension of the output register 4, in reality it may be bent around the imager for packaging reasons.

Figure 2:
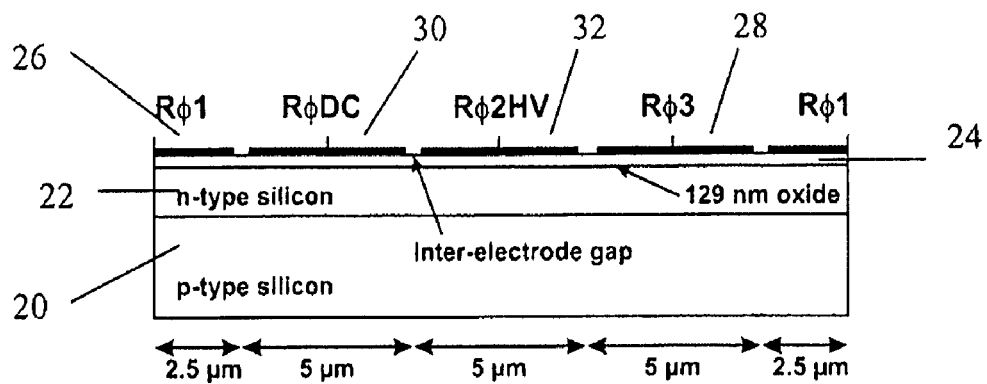
FIG. 2: is a schematic diagram of a physical cross section of one element in a multiplication register.

A multiplication element of known type is shown in FIG. 2. The element comprises a base 20 of p-type silicon, an n-type layer 22 and a gate dielectric layer 24 which may, as an example, comprise a layer of Si3N4 over SiO2 or SiO2 only. On the gate dielectric layer, each element has four electrodes shown as normal clocked electrodes $\phi 1$ 26 and $\phi 3$ 28, a DC electrode $\phi DC$ 30 and a high voltage electrode $\phi 2HV$ 32. The element provides gain by clocking voltages at the electrodes such that a relatively high voltage at electrode $\phi HV$ 32 causes impact ionisation of charge. The naming convention of the electrodes in the format "R$\phi 1$" as shown in the diagrams is well known and will be referred to herein as "$\phi 1$" for brevity. Similarly, the high voltage electrode "$\phi 2HV$" may be referred to as "$\phi 2$" for brevity.

Figure 3:
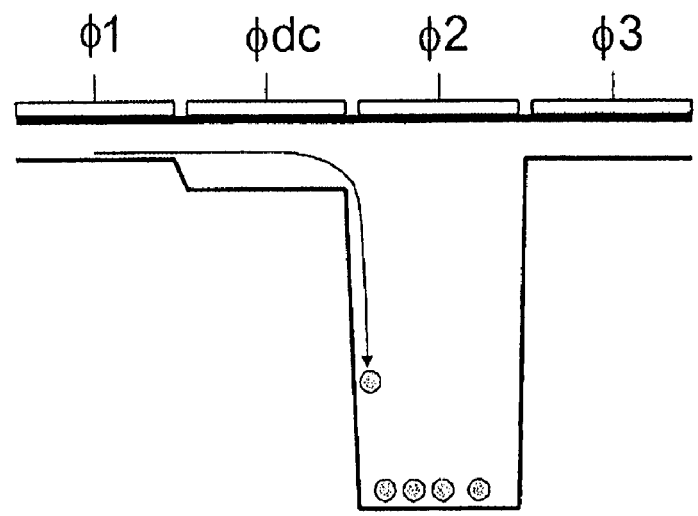
FIG. 3: is a schematic cross section of a single multiplication element showing voltages applied to electrodes at a point in time.

A schematic cross section of a single multiplication element is given in FIG. 3. The multiplication element of the multiplication register is made up of four phases although other configurations could be possible. $\phi 1$ and $\phi 3$ are clocked as normal readout register phases. $\phi DC$ is a DC phase that separates $\phi 1$ from $\phi 2$. The high voltage electrode $\phi 2$, the multiplication phase, is a clocked phase but using a much greater amplitude than $\phi 1$ and $\phi 3$. On the high to low transition of $\phi 1$ (the potential increasing in the direction of the arrow in FIG. 3), the signal originally under $\phi 1$ will drift to $\phi 2$. The potential on $\phi 2$ is set high enough so that the fields experienced by the electron signal will cause impact ionisation to take place. Once the signal electrons and the electrons created by the impact ionisation are collected under $\phi 2$ the total amplified signal can then be transferred to $\phi$ by switching $\phi 2$ low and $\phi$ high. The process is repeated through all the gain (multiplication) elements in the multiplication register. As an example, the device could have 591 gain elements. If the impact ionisation increases the signal by 1% at each element, the combined gain of the multiplication register of the CCD will be $1.01^{591}=358$.

Figure 4:
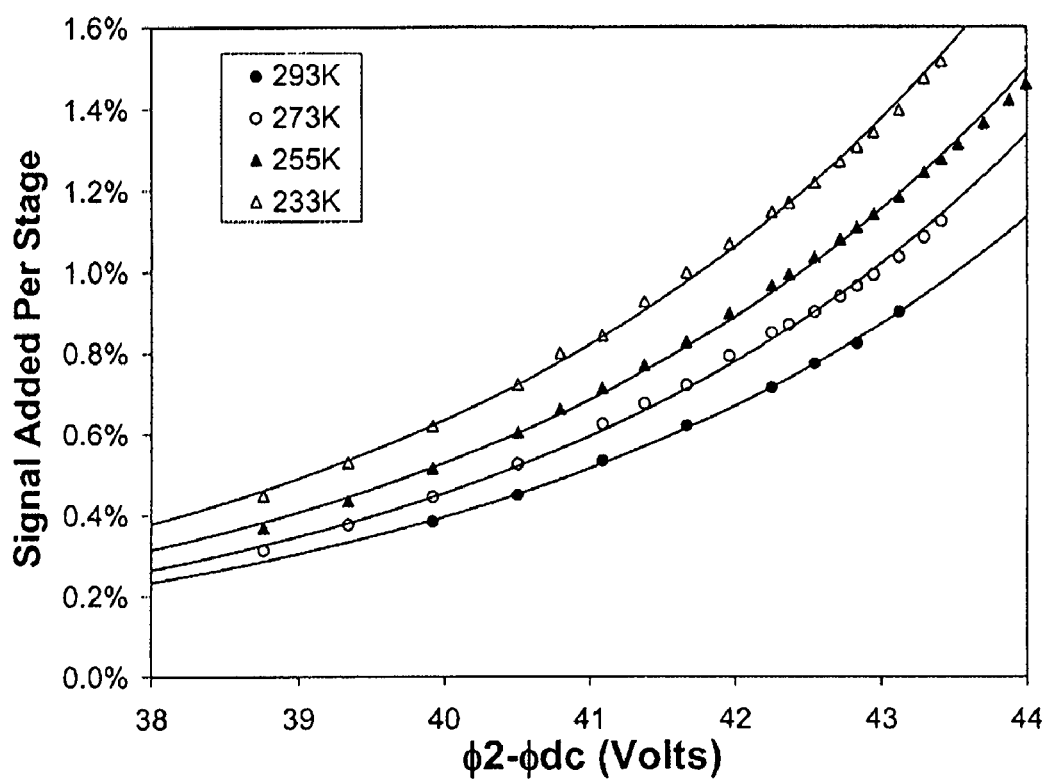
FIG. 4: shows how gain varies with voltage difference and with temperature.

As shown, charge is increased in each (multiplication) element by application of voltage at $\phi 2$ (HV) which causes electrons to form from the impact ionisation process. It is noted, for the avoidance of doubt, that the voltages shown are clocked and so vary in amplitude. The voltages are shown at a given instant. The way that gain varies with voltage and temperature is shown in FIG. 4.

Embodiments are now described with reference to FIGS. 5 and 6. In both embodiments the CCD device forms part of a frame transfer CCD camera.

Figure 5:
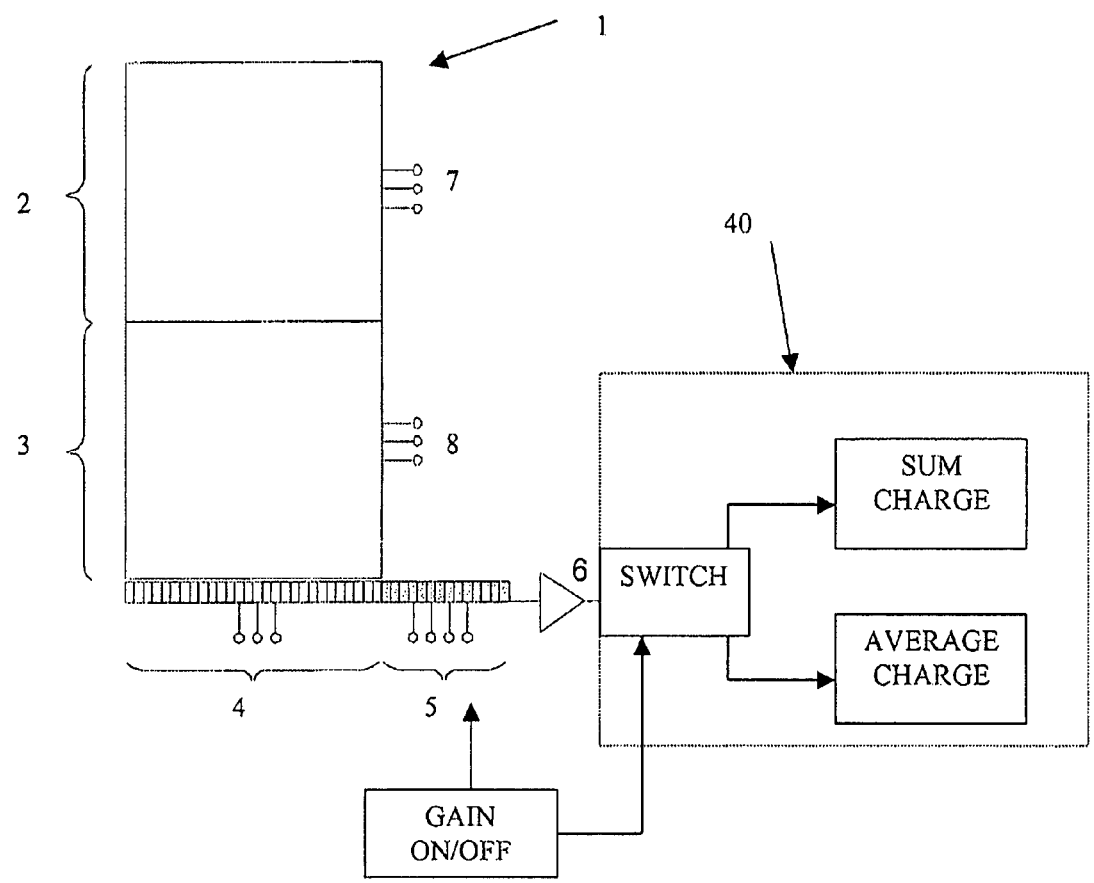
FIG. 5: shows a first CCD imaging device embodying the invention.

The embodiment of FIG. 5 makes use of thermal charge accumulated as a mechanism of providing a known ratio of signals. As previously described, an image area 2 accumulates charge in CCD elements and transfers charge under control of clocked drive pulses on electrodes 7, 8 to a store area 3 and from the store area to an output register 4 and subsequently to a multiplication register 5.

In cameras employing Frame Transfer CCDs, a period of time is required at the end of each image capture interval to transfer the newly acquired image into the store area. This interval is a function of the number of lines to be transferred and the line transfer rate. For cameras compliant with TV standards this interval may be extended to meet the demands of the TV standard (field blanking interval). Therefore there will always be some period where no image data is being read from the CCD, and this period, we appreciated, is available for a calibration function.

The camera operates as follows. When the last line of a previous field has been transferred from the store area 3 to the output register 4, the adjacent line in the store section will contain thermal charge accumulated over the field readout interval—typically 20 ms for CCIR cameras. The thermal charge accumulated in this period is then transferred into the readout register 4. The gain provided by the multiplication register is maintained at a given value, and the pixels are readout normally. The camera processor 40 has a function to average all the pixels to obtain a single value (S gain). The data from all pixels may be assessed further to gain confidence that the observed standard deviation is consistent with the calculated mean value.

The following line, which will contain a similar amount of dark current, is then transferred to the readout register 4, the gain of the multiplication register 5 is adjusted to apply unity gain, all pixels in the line are then summed in an output node of the CCD shown as the processor 40, and readout as a single value (S unity).

The processor 40 now has two output values: S gain derived from the mean value of a charge due to thermal electrons in a single element with gain applied; and S unity derived from the sum of charge in all the elements of the readout register without gain applied. S unity is thus the average charge in each element of the readout register×the number of pixels in the line of the readout register. Summing ensures that the very small thermally generated signal will exceed the output node readout noise. It is noted that the summing could be done before or after the multiplication register and has the effect of creating an output signal which is, in effect, derived from the sum of the charge input to the multiplication register.

Gain may then be calculated from:

$$G = S\ \text{gain} \times \text{Number of pixels in line} / S\ \text{unity}$$

This figure may then be used to make automatic adjustment of gain limits, to determine when filters should be applied to the image, and for presentation to the user as an absolute gain value.

The technique described allows acquisition of an updated gain value at each field period. Since the gain control voltage is arranged to be very stable over a few hundred milliseconds it may be advantageous to measure gain value for several fields and then compute the average.

Where field blanking intervals must be kept as short as possible, to maintain high frame rates, it may be advantageous to generate S unity value in one field and S gain value in a subsequent field.

The CCD will typically be operating at temperatures of −5° C., or lower. In the embodiment, this would produce of the order 1 electron/pixel/field. With roughly 600 pixels in each line, this will result in 600 electrons at the output node, which is just about adequate to overcome the node readout noise.

A further enhancement where the electron levels are low is to produce the S unity signal by "binning" a few lines into the readout register. The process of "binning" means summing a few lines from the store area 3 into the readout/output register 4 thereby producing more electrons. If this is done, the equation above is modified to include the number of lines binned as a multiplier.

Figure 6:
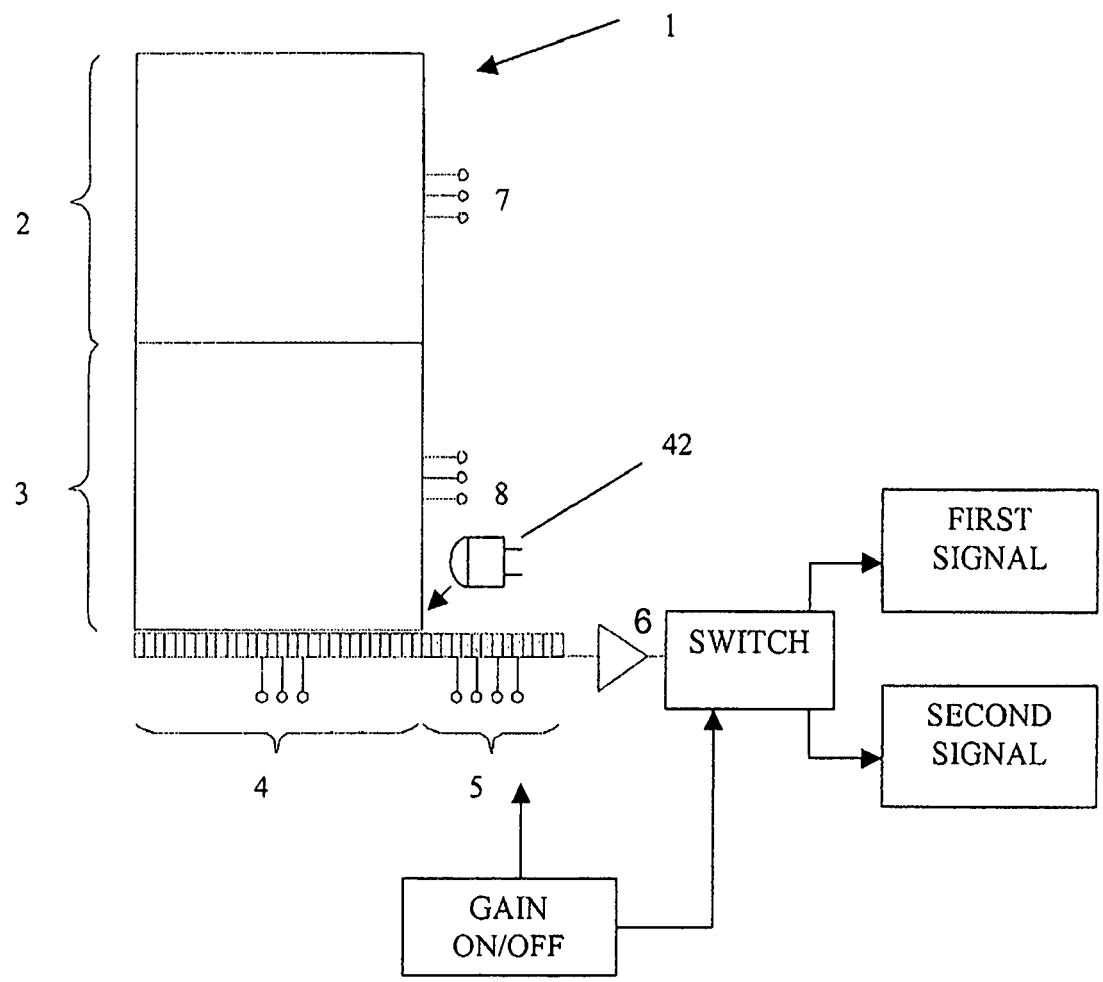
FIG. 6: shows a second CCD imaging device embodying the invention.

A second embodiment is shown in FIG. 6 and is based on the principles of the first, namely providing two respective input signals to the multiplication register that are orders of magnitude apart (by a known amount) and measuring the ratio of the output signals with and without gain respectively.

In the second embodiment, rather than using charge accumulated due to thermal electrons (known as dark current), a light source such as an LED 42 is located so as to illuminate a light sensitive region prior to the input end of the multiplication register. The operation is then as follows. First, the LED illuminates the light sensitive region with a low level (or for a short time) to produce a low charge. This low charge is clocked through the multiplication register with normal gain applied to produce a signal S gain. Then, the LED illuminates the sensitive region with a high level (or for a longer time) to produce a high charge. This high charge is clocked through the multiplication register without gain applied to produce a signal S unity. Importantly, the ratio of the first and second illuminations is known. The gain can then be determined by:

$$G = S\ \text{gain} \times \text{ratio of illumination levels} / S\ \text{unity}$$

A minimum of two line periods will typically be required for readout of the charge.

The use of the illuminating LED allows the ratio of charge for the two signals to be precisely controlled. This assumes that it is possible to adjust gain rapidly in the inter-line interval. The embodying circuit generating the control voltage has been designed to be very stable, and it is therefore preferable not to change the amplitude rapidly of any of the clocking signals (this approach would require the amplitude to be restored very precisely to within a few millivolts). However, gain is also dependent upon the phase relationship between φ1 and φ2HV phases, and the clock sequencer can control phase, virtually instantaneously. Accordingly, this is the preferred mechanism to reduce gain of the multiplication register to unity in either the first or second embodiment. This has a further advantage in that the HV clock voltage will not be disturbed, so gain will remain stable when the phase is returned to normal. Since this procedure occurs outside the normal image boundaries it will have no effect on Automatic Level Control calculations. Of course, the gain provided by elements can be controlled by adjusting the voltage applied to the RφDC electrode between the Rφ1 and Rφ2HV electrodes. This is an equally valid approach.

A camera embodying the invention comprises a lens arrangement for imaging light onto a CCD device of the type previously described and output electronics for processing signals from the CCD device.

The invention claimed is:

1. A CCD device of the type for providing charge gain by impact ionisation, comprising a store section, a readout register having a plurality of elements, and a multiplication register for producing charge gain having a plurality of elements, the multiplication register having an output arranged to provide:

a first output signal based on a given input and provided from the multiplication register with gain applied, wherein the given input comprises charge from the plurality of elements of the readout register that occurs due to thermal electrons accumulated in the store section in a defined time period, and the first output signal is representative of the mean of the charge in the plurality of elements; and a second output signal based on a known multiple of the given input and provided from the multiplication register with substantially no gain applied, wherein the second output signal is the sum of the charge in the plurality of elements;

whereby the gain of the multiplication register is derivable from the first and second signals and the known multiple.

2. A CCD device according to claim 1, wherein the second output signal is produced by summing charge from the plurality of elements prior to the multiplication register.

3. A CCD device according to claim 1, wherein the second output signal is produced by summing signals from the multiplication register derived from each of the plurality of elements.

4. A CCD device according to claim 2, wherein gain is derived as a function of the ratio of the first and second output signals and the number of elements in the readout register.

5. A CCD device according to claim 1, further comprising a light sensitive CCD array wherein the charge in the readout register is obtained from charge which accumulates due to thermal electrons in the light sensitive CCD array during an interval between the start of successive readouts.

6. A CCD device according to claim 1, further comprising a light sensitive CCD array wherein the charge in the readout register is obtained from charge which accumulates due to thermal electrons in the light sensitive CCD array during an interval between the start of successive readouts and is summed from a plurality of rows of the light sensitive CCD array into the readout register during a blanking interval.

7. A method of operating CCD device of the type for providing charge gain by impact ionisation, comprising a store section, a readout register having a plurality of elements, and a multiplication register for producing charge gain having a plurality of elements, the method comprising:

deriving a first output signal based on a given input and provided from the multiplication register with gain applied, wherein the given input comprises charge from the plurality of elements of the readout register that occurs due to thermal electrons accumulated in the store section in a defined time period, and the first output signal is representative of the mean of the charge in the plurality of elements; and deriving a second output signal based on a known multiple of the given input and provided from the multiplication register with substantially no gain applied, wherein the second output signal is the sum of the charge in the plurality of elements; and deriving the gain of the multiplication register from the first and second signals and the known multiple.

8. A method according to claim 7, comprising producing the second output signal by summing charge from the plurality of elements prior to the multiplication register.

9. A method according to claim 7, comprising producing the second output signal by summing signals from the multiplication register derived from each of the plurality of elements.

10. A method according to claim 8, comprising deriving the gain as a function of the ratio of the first and second output signals and the number of elements in the readout register.

11. A method according to claim 7, comprising obtaining charge by accumulating thermal electrons in a light sensitive CCD array during an interval between the start of successive readouts and deriving the first and second output signals from the charge so obtained.

12. A method according to claim 11, further comprising summing thermal charge from a plurality of rows of the light sensitive CCD array into the readout register.

* * * * *